United States Patent
Chen et al.

(10) Patent No.: US 9,305,127 B2
(45) Date of Patent: Apr. 5, 2016

(54) P-CELL CACHING

(71) Applicant: Synopsys Taiwan Co., Ltd., Taipei (TW)

(72) Inventors: Wei-Cheng Chen, Chiayi (TW); Jen-Feng Huang, Hsinchu (TW)

(73) Assignee: Synopsys Taiwan Co., Ltd., Taipei (TW)

(*) Notice: Subject to any disclaimer, the term of this patent is extended or adjusted under 35 U.S.C. 154(b) by 0 days.

(21) Appl. No.: 14/541,555

(22) Filed: Nov. 14, 2014

(65) Prior Publication Data

US 2015/0143310 A1 May 21, 2015

Related U.S. Application Data

(60) Provisional application No. 61/904,597, filed on Nov. 15, 2013.

(51) Int. Cl.
*G06F 17/50* (2006.01)

(52) U.S. Cl.
CPC .................. *G06F 17/5045* (2013.01)

(58) Field of Classification Search
CPC ............ G06F 17/5068; G06F 17/3048; G06F 17/5081; G06F 17/5063
USPC ........................................ 716/107
See application file for complete search history.

(56) References Cited

U.S. PATENT DOCUMENTS

| | | | |
|---|---|---|---|
| 7,698,662 B1* | 4/2010 | Wu et al. | 716/104 |
| 7,949,987 B1* | 5/2011 | Ginetti et al. | 716/139 |
| 8,046,730 B1* | 10/2011 | Ferguson et al. | 716/139 |
| 8,281,272 B1* | 10/2012 | Ginetti | 716/119 |
| 2009/0007031 A1* | 1/2009 | Ginetti et al. | 716/4 |
| 2010/0115207 A1* | 5/2010 | Arora et al. | 711/144 |
| 2011/0219349 A1* | 9/2011 | Foster et al. | 716/136 |
| 2013/0298092 A1* | 11/2013 | Ting et al. | 716/102 |
| 2013/0298262 A1* | 11/2013 | Su et al. | 726/34 |

* cited by examiner

*Primary Examiner* — Suchin Parihar
(74) *Attorney, Agent, or Firm* — Alston & Bird LLP

(57) ABSTRACT

In one or more embodiments, a caching apparatus includes functionality to persist evaluation results associated with pcells in a design across sessions of an EDA application as well as across design libraries. The caching apparatus may create and maintain a mirror cache in a design library with only subMasters referenced by the design library. The contents of a central cache file or a mirror cache in the design library are examined for an evaluation result. If the evaluation result is not found in the central cache file, the evaluation result may be retrieved from the mirror cache if present.

15 Claims, 8 Drawing Sheets

P-CELL CACHING

CROSS-REFERENCES TO RELATED APPLICATIONS

This application claims the benefit of and priority to U.S. Provisional Patent Application No. 61/904,597, filed Nov. 15, 2013, and entitled "P-Cell Caching," the entire disclosure of which is hereby incorporated by reference.

BACKGROUND OF THE INVENTION

1. Field of the Invention

The present disclosure relates to electronic-design-automation (EDA) techniques. More specifically, the present disclosure relates to technique for using previously designed parameterized cells in a new technology.

2. Related Art

Electronic design automation (EDA) tools allow for the hierarchical design of integrated circuits, in which portions of large designs may be divided into manageable subsections which can be worked on independently by designers. Specifically, an EDA tool can create and manipulate a design using OpenAccess which defines a standardized data model and interface for representing and accessing the design.

A parameterized cell (pcell) allows a designer to create a design that can be adapted to a particular situation based on a set of parameters. Specifically, a designer can provide zero or more parameter values to a pcell during instantiation. If a parameter value is not provided to the pcell, a default value for that parameter can be used. Next, the source code of the pcell is executed which uses the supplied and/or default parameter values to generate a customized instance of the pcell.

Accordingly, what is desired is to solve problems relating to using previously designed parameterized cells in a new technology, some of which may be discussed herein. Additionally, what is desired is to reduce drawbacks relating to EDA applications which use pcells, some of which may be discussed herein.

BRIEF SUMMARY OF THE INVENTION

The following portion of this disclosure presents a simplified summary of one or more innovations, embodiments, and/or examples found within this disclosure for at least the purpose of providing a basic understanding of the subject matter. This summary does not attempt to provide an extensive overview of any particular embodiment or example. Additionally, this summary is not intended to identify key/critical elements of an embodiment or example or to delineate the scope of the subject matter of this disclosure. Accordingly, one purpose of this summary may be to present some innovations, embodiments, and/or examples found within this disclosure in a simplified form as a prelude to a more detailed description presented later.

In various embodiments, evaluation of a pcell in order to generate an instance of the pcell in a design is postponed from an evaluation stage to an instance header binding stage. This allows an EDA application to know which whether an evaluation result is cached within a central cache or a mirror cache in a design library. The mirror cache file in a design library may be backed up or synchronization performed between a mirror cache and a central cache.

A further understanding of the nature of and equivalents to the subject matter of this disclosure (as well as any inherent or express advantages and improvements provided) should be realized in addition to the above section by reference to the remaining portions of this disclosure, any accompanying drawings, and the claims.

BRIEF DESCRIPTION OF THE DRAWINGS

In order to reasonably describe and illustrate those innovations, embodiments, and/or examples found within this disclosure, reference may be made to one or more accompanying drawings. The additional details or examples used to describe the one or more accompanying drawings should not be considered as limitations to the scope of any of the claimed inventions, any of the presently described embodiments and/or examples, or the presently understood best mode of any innovations presented within this disclosure.

DETAILED DESCRIPTION OF THE INVENTION

Introduction

The following description is presented to enable any person skilled in the art to make and use the disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Embodiments of a computer system, a method, a graphical user interface and a computer-program product (i.e., software) for use with the computer system are described. A circuit designer may use these systems, devices, and/or techniques to configure and monitor the execution of tasks in a user-configurable electronic-design-automation (EDA) flow associated with a circuit or circuit design. In particular, using an intuitive and interactive graphical user interface in EDA software, the circuit designer can configure and initiate execution of the EDA flow. Then, during execution of EDA tasks in the EDA flow, an execution monitor in the graphical user interface may provide a graphical representation of real-time execution status information for the EDA tasks. Moreover, using the EDA software, the circuit designer can debug the circuit design if any errors or problems occur.

By providing real-time feedback on progress and any problems, these devices and techniques can improve: project visibility, productivity and/or predictability. For example, using these devices and techniques, chip designers can design circuits or chips that are manufacturing ready in a single-pass design cycle. Consequently, these devices and techniques may make it easier for chip designers to design circuits or chips, which can decrease the time and cost of circuit or chip design, thereby increasing customer satisfaction and retention.

Figure 1:
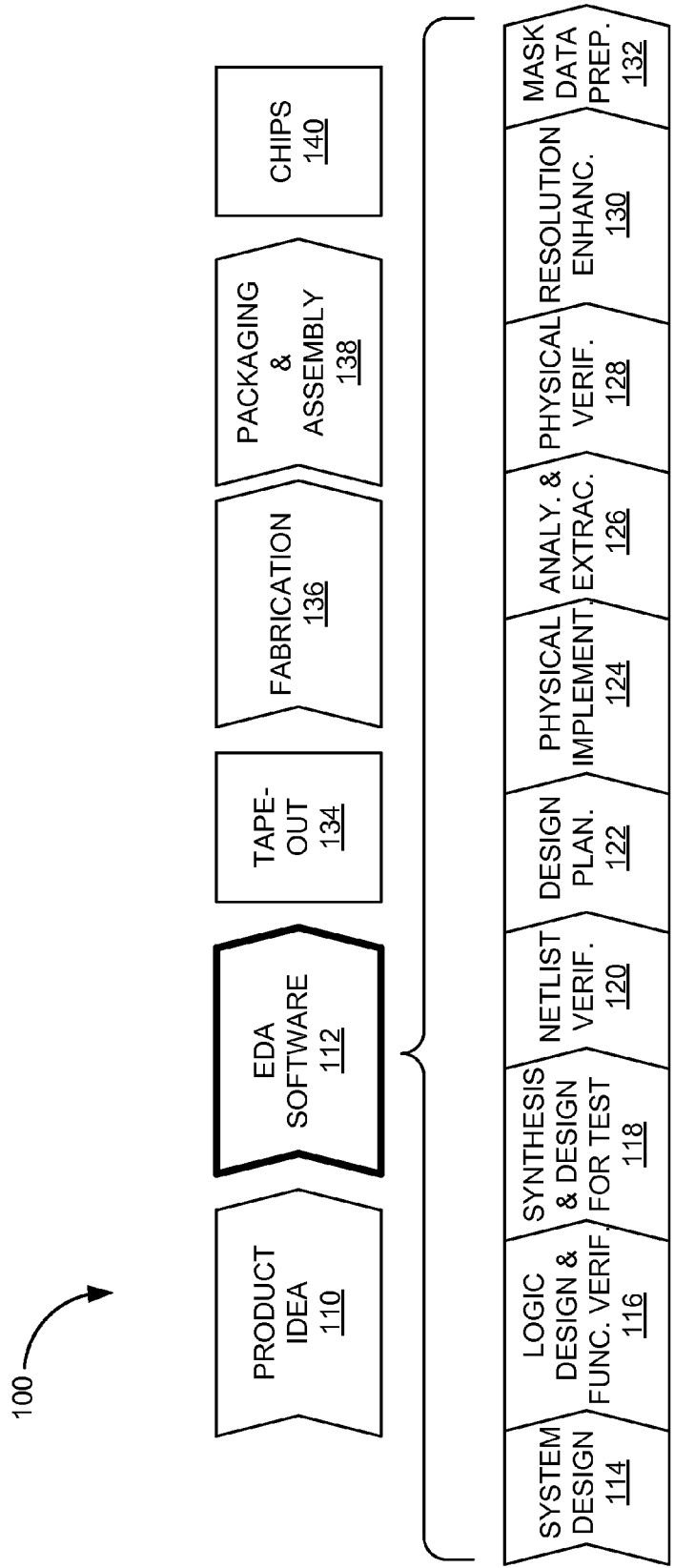
FIG. 1 is a flowchart illustrating various operations in the design and fabrication of an integrated circuit in accordance with an embodiment of the present disclosure.

Embodiments of design and fabrication of integrated circuits or chips are now described with reference to FIG. 1. FIG. 1 is flowchart 100 illustrating the various operations in the design and fabrication of an integrated circuit. This process starts with the generation of a product idea (110), which is realized during a design process that uses electronic design automation (EDA) software (112). When the design is finalized, it can be taped-out (134). After tape-out, a semiconductor die is fabricated (136) and packaging and assembly processes (138) are performed, which ultimately result in finished chips (140).

Note that the design process that uses EDA software (112) includes operations 114-132, which are described below. This design flow description is for illustration purposes only. In particular, this description is not meant to limit the present disclosure. For example, an actual integrated circuit design may require a designer to perform the design operations in a different sequence than the sequence described herein.

During system design (114), designers describe the functionality to implement. They can also perform what-if planning to refine the functionality and to check costs. Note that hardware-software architecture partitioning can occur at this stage. Exemplary EDA software products from Synopsys, Inc. of Mountain View, Calif. that can be used at this stage include: Model Architect®, Saber, System Studio®, and Designware® products.

Then, during logic design and functional verification (116), VHDL or Verilog code for modules in the circuit is written and the design is checked for functional accuracy. More specifically, the design is checked to ensure that it produces the correct outputs. Exemplary EDA software products from Synopsys, Inc. of Mountain View, Calif. that can be used at this stage include: VCS®, Vera®, Designware®, Magellan®, Formality®, ESP® and Leda® products.

Next, during synthesis and design for test (118), VHDL/Verilog is translated to a netlist. This netlist can be optimized for the target technology. Additionally, tests can be designed and implemented to check the finished chips. Exemplary EDA software products from Synopsys, Inc. of Mountain View, Calif. that can be used at this stage include: Design Compiler®, Physical Compiler®, Test Compiler®, Power Compiler®, FPGA Compiler®, Tetramax®, and Designware® products.

Moreover, during netlist verification (120), the netlist is checked for compliance with timing constraints and for correspondence with the VHDL/Verilog source code. Exemplary EDA software products from Synopsys, Inc. of Mountain View, Calif. that can be used at this stage include: Formality®, Primetime®, and VCS® products.

Furthermore, during design planning (122), an overall floor plan for the chip is constructed and analyzed for timing and top-level routing. Exemplary EDA software products from Synopsys, Inc. of Mountain View, Calif. that can be used at this stage include: Astro® and IC Compiler® products.

Additionally, during physical implementation (124), the placement (positioning of circuit elements) and routing (connection of the same) occurs. Exemplary EDA software products from Synopsys, Inc. of Mountain View, Calif. that can be used at this stage include: the Astro® and IC Compiler® products.

Then, during analysis and extraction (126), the circuit function is verified at a transistor level, which permits refinement. Exemplary EDA software products from Synopsys, Inc. of Mountain View, Calif. that can be used at this stage include: Astrorail®, Primerail®, Primetime®, and Star RC/XT® products.

Next, during physical verification (128), the design is checked to ensure correctness for: manufacturing, electrical issues, lithographic issues, and circuitry. Exemplary EDA software products from Synopsys, Inc. of Mountain View, Calif. that can be used at this stage include the Hercules® product.

Moreover, during resolution enhancement (130), geometric manipulations of the layout are performed to improve manufacturability of the design. Exemplary EDA software products from Synopsys, Inc. of Mountain View, Calif. that can be used at this stage include: Proteus®, Proteus®AF, and PSMGED® products.

Additionally, during mask-data preparation (132), the "tape-out" data for production of masks to produce finished chips is provided. Exemplary EDA software products from Synopsys, Inc. of Mountain View, Calif. that can be used at this stage include the CATS® family of products.

Embodiments of the present disclosure can be used during one or more of the above-described stages. Specifically, in some embodiments the present disclosure can be used in EDA software that includes operations between design (114) and resolution enhancement (130).

We now describe embodiments of a technique for design portion of the EDA flow. EDA software may provide interactive flow-control environment that includes EDA tools, utilities and automation which allow a user (such as a chip designer) to design a circuit or a chip, including: layout, node optimization, and EDA flows that include multiple EDA tasks or tool scripts. These EDA flows may include block-level flows and full-chip hierarchical flows, which act on a circuit or chip design (which is henceforth referred to as a circuit design).

To accelerate circuit development using the EDA software, the user may use a variety of preconfigured or predefined content, including EDA tool scripts with default technology settings and/or default flows associated with blocks in the circuit design. However, the EDA software also supports user-defined technology settings and block configurations (i.e., the EDA software is programmable).

In general, a particular design may be specified by a corresponding user-configurable EDA flow, which includes a sequence of blocks having associated block flows and sub-block or step flows. A given block in the sequence of blocks may include one or more sub-block flows, and a given sub-block in the sub-block flow may represent a sequence of EDA tasks that are performed on a circuit design.

In the discussion that follows, an EDA task is defined as an EDA tool script that performs a single or small number of related commands on a circuit design. For example, the EDA tasks may include: an elaborate script, a synthesis script, a clock route script, a design-implementation script, a design-optimization script, a design-analysis script, etc. In contrast with operating-system processes, these commands operate on a circuit design. Note that each EDA task may involve multiple operating-system processes.

Moreover, a step flow (or a sub-block flow) is defined as a collection or sequence of inter-coupled EDA tasks that operate on the circuit design. In general, step flows are grouped into functional areas such as: synthesis, floor planning, place and route, chip finishing, etc.

Additionally, a block flow is defined as a collection or sequence of inter-coupled step flows that complete at least a portion of the circuit design. Note that block flows can be hierarchical flows (e.g., flows that have a treed structure with a root level and one or more dependent branches). Furthermore, many circuit designs are specified as a sequence of inter-coupled blocks (and their associated flows).

The EDA software can include foundry-ready technology, designs and libraries, such as EDA tool scripts and flow templates that are preconfigured based at least in part on the requirements associated with particular semiconductor manufacturers or manufacturing facilities, and which are already validated. In addition, the EDA software may provide preconfigured foundry-specific checklists and documentation to assist the user in prompt and successful tape-out of the circuit design.

In order to improve product visibility (and, thus, user productivity), the EDA software may also support the generation of on-demand management reports, including real-time queries during the execution of a user-configurable EDA flow. These reports may be user configured, and may allow the user to monitor performance metrics, such as: area utilization, clock speed, power consumption, and/or any errors that occur during execution of the user-configurable EDA flow.

P-Cell Caching

Figure 2:
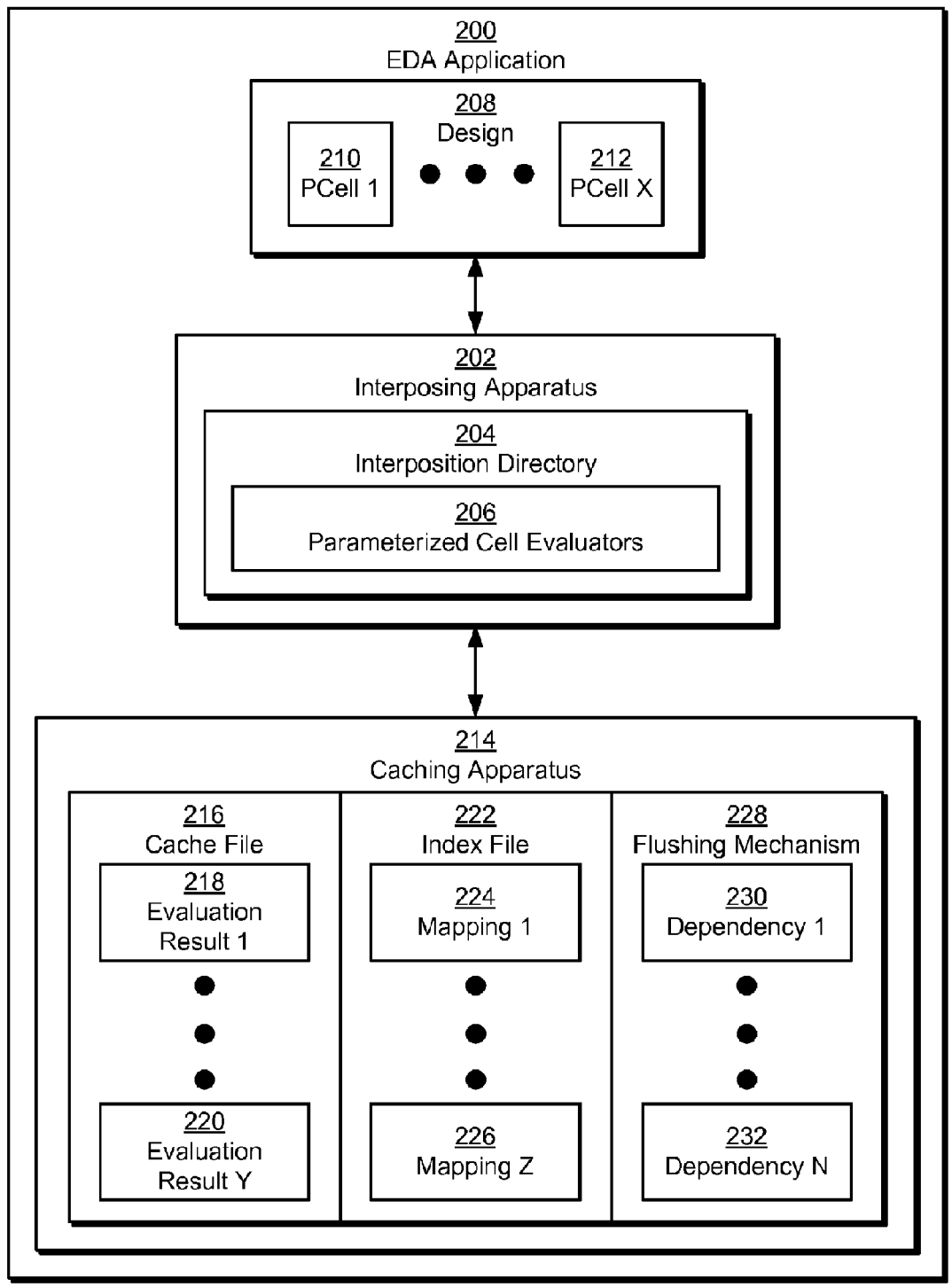
FIG. 2 shows an electronic design automation (EDA) application in accordance with an embodiment.

FIG. 2 shows an EDA application 200 in accordance with an embodiment. As shown in FIG. 2, EDA application 200 includes an interposing apparatus 202, a design 208, and a caching apparatus 214. Each of these components is described in further detail below.

Design 208 may correspond to an abstract representation of an integrated circuit that uses graphical objects to represent components in the integrated circuit. For example, design 208 may correspond to an OpenAccess design, such as a schematic, or a layout. Design 208 may contain symbols that represent resistors, capacitors, transistors, logic gates, and/or other components in the integrated circuit. The graphical objects may additionally be connected by lines that represent power, ground, and/or signal connections between the components. In other words, the functionality of the integrated circuit may be illustrated by the components and interconnections within design 208.

Design 208 may be created using EDA application 200. For example, EDA application 200 may correspond to a schematic editor that allows a user to create design 208 on a computer system. Moreover, EDA application 200 may allow design 208 to be created hierarchically. In particular, design 208 may include a hierarchy of cells which themselves may instantiate other designs.

Changes to a cell master may be propagated to each cell instance of the master in design 208. For example, a transistor and a gate may be designed as masters at the bottom of the hierarchy. A master of an inverter may then be created from the transistor and gate at the next level of the hierarchy, and a master of a buffer may be created from two inverters at the level above that of the inverter's. Changes to the master of the transistor may thus be propagated to cell instances of the transistor within the inverter, buffer, and/or other cells containing the transistor.

Parameterized cells can facilitate the centralized creation and/or reuse of components in a design. Each pcell may be associated with a set of parameters that affect the instantiation of the pcell. A pcell, e.g., a super-master in OpenAccess, includes source code for generating an instance of the pcell (e.g. a sub-master in OpenAccess), as well as a set of default parameter values for the pcell's parameters. To instantiate a pcell within a design, the source code for the pcell may be executed by a pcell evaluator using the parameters of that pcell instantiation. For example, a plug-in corresponding to a C++ pcell evaluator may be used to instantiate pcells from super-masters that are written in C++, while a separate plug-in implementing a Tcl pcell evaluator may be used to instantiate pcells from Tcl super-masters.

Variants of a pcell (e.g., sub-masters in OpenAccess) may correspond to instantiations of the pcell using different sets of parameter values. For example, a pcell for a transistor may include parameters for the transistor's width, length, and/or the shapes of the polygons. The transistor's pcell may include a default width of 4 units, a default length of 1 unit, and a default number of fingers of 1 (some transistor layouts include a shape that has multiple projections which are often referred to as "fingers"). The transistor may also include two variants with different parameter values; the first variant may include a width of 4 units, a length of 1 unit, and two fingers, and the second variant may have a width of 6 units, a length of 2.5 units, and one finger.

Because computational resources may be consumed during pcell evaluation (e.g., executing source code for the pcell), evaluation results for variants of the pcell may be cached for future instantiation of the pcell in lieu of repeated evaluation of the pcell. For example, caching apparatus 214 and interposing apparatus 202 may provide in-memory caching of OpenAccess pcells, in which each variant in design 208 is evaluated once per session of EDA application 200 and cached for reuse during the session. Note that the user may open and close a design or a super-master multiple times within the same session.

In conventional approaches, each time a user closes a design or a super-master, the evaluation results are flushed from memory. In contrast, caching apparatus 214 can persist evaluation results (e.g., by storing them on disk) within a session of the EDA application so that the evaluation results are available even after they have been flushed from memory (e.g., when a user closes a design or a super-master). However, per-session evaluations of variants in design 208 may still affect computational performance in a noticeable way. For example, the opening of a large integrated circuit design may incur significant computational overhead and/or delay within EDA application 200 by requiring the individual evaluation of millions of variants before the design may be viewed and/or modified by the user.

In one or more embodiments, caching apparatus 214 includes functionality to persist evaluation results associated with pcells in design 208 across sessions of EDA application 200. In particular, caching apparatus 214 may maintain a cache file 216 of evaluation results (e.g., evaluation result 1 218, evaluation result y 220) of variants of a pcell. In some embodiments, the system uses one cache file per pcell. In these embodiments, all the variants of the pcell are stored in the cache file for that pcell. Each variant's evaluation result may be stored at a particular location in cache file 216, with newer evaluation results written at higher offsets than older evaluation results. Note that embodiments of the present invention are not limited to a particular order for storing the evaluation results. For example, in some embodiments, newer evaluation results may be written at lower offsets than older evaluation results. Cache file 216 may additionally contain an evaluation result of the pcell with default values if an instance of the pcell is used in design 208 with default values. In particular, for each parameter, if a value is provided, then the provided value is used, otherwise, the default value is used. Note that a variant in which a parameter is not provided (i.e. it is defaulted) and a variant in which the default value is explicitly provided are treated as different variants even though the evaluation result would be the same for both variants. In some embodiments, the two variants may be treated the same way, i.e., the system may use a single variant for both situations. However, in such embodiments, the cache entry associated with the variant may need to be invalidated more often.

Moreover, caching apparatus 214 may maintain an index file 222 containing a mapping (e.g., mapping 1 224, mapping z 226) of each variant to the location of the variant's evaluation results in cache file 216. In other words, index file 222 may allow the current evaluation result for a given variant to be located in cache file 216 and used in instantiating the pcell without the overhead of evaluating the pcell source code. Cache file 216 and index file 222 may be written to non-volatile storage to persist the evaluation results beyond the termination of EDA application 200. For example, caching apparatus 214 may periodically write in-memory representations of cache file 216 and index file 222 to disk during the creation of design 208 within EDA application 200.

To enable use of the persisted evaluation results in instantiating the pcell, interposing apparatus 202 may transparently intercept evaluation requests for pcells to one or more pcell evaluators 206. In one or more embodiments, interposing apparatus 202 corresponds to a plug-in in EDA application 200. To use interposing apparatus 202, plug-ins corresponding to pcell evaluators 206 may be registered in interposition directory 204. If the system attempts to load a plug-in for a pcell evaluator, interposing apparatus 202 may be loaded instead which then may itself load the original interposed evaluator for its own use during cache miss.

To respond to the evaluation request, interposing apparatus 202 may examine the contents of cache file 216 and/or index file 222 for an evaluation result that matches the evaluation request. Interposing apparatus 202 may then instantiate the pcell from cache file 216 if the evaluation result is found in cache file 216. If the evaluation result is not found in cache file 216, interposing apparatus 202 may identify the original pcell evaluator targeted by the evaluation request and pass the evaluation request to the original pcell evaluator.

The contents of cache file 216 and/or index file 222 may also be periodically discarded to ensure the validity of the evaluation results. In one or more embodiments, a flushing mechanism 228 in caching apparatus 214 discards the persisted evaluation results in cache file 216 based at least on a dependency (e.g., dependency 1 230, dependency n 232) associated with the pcell. In other words, the discarding of evaluation results in cache file 216 may be based on one or more factors that represent the dependency. The dependency may correspond to a file and/or function or constraint rule used to generate an evaluation result. For example, flushing mechanism 228 may check timestamps, file paths, pcell evaluator versions, expression values, and/or function return values to ensure that one or more files, pcell evaluators, and/or constraint values (e.g., the minimum distance between two shapes) used to generate the evaluation result have not changed since the most recent caching of the evaluation result in cache file 216. Flushing mechanism 228 may turn off dependency checking if the pcells have been "frozen" to isolate the workflow from frequent changes in the set of dependencies.

P-Cell Mirror Caching

Even with the evaluation results for variants of the pcell being cached for future instantiation of a pcell in lieu of repeated evaluation of the pcell, pcell cache files are outside of libraries. Users must spend extra effort to maintain cache files and it's easy to lose cache files when exchanging libraries for new technologies. The results of re-generation may be different from old ones.

In one or more embodiments, caching apparatus 214 includes functionality to persist evaluation results associated with pcells in design 208 across sessions of EDA application 200 as well as across libraries. In particular, caching apparatus 214 may create and maintain a mirror cache in a design library with only subMasters referenced by this design library. To respond to the evaluation request, interposing apparatus 202 may examine the contents of cache file 216 and/or index file 222 for an evaluation result that matches the evaluation request. If the evaluation result is not found in cache file 216, caching apparatus 214 may retrieve the evaluation result from a mirror site. Caching apparatus 214 utilizes mirror sites to reduce the time for subMaster re-evaluation across libraries.

Figure 3:
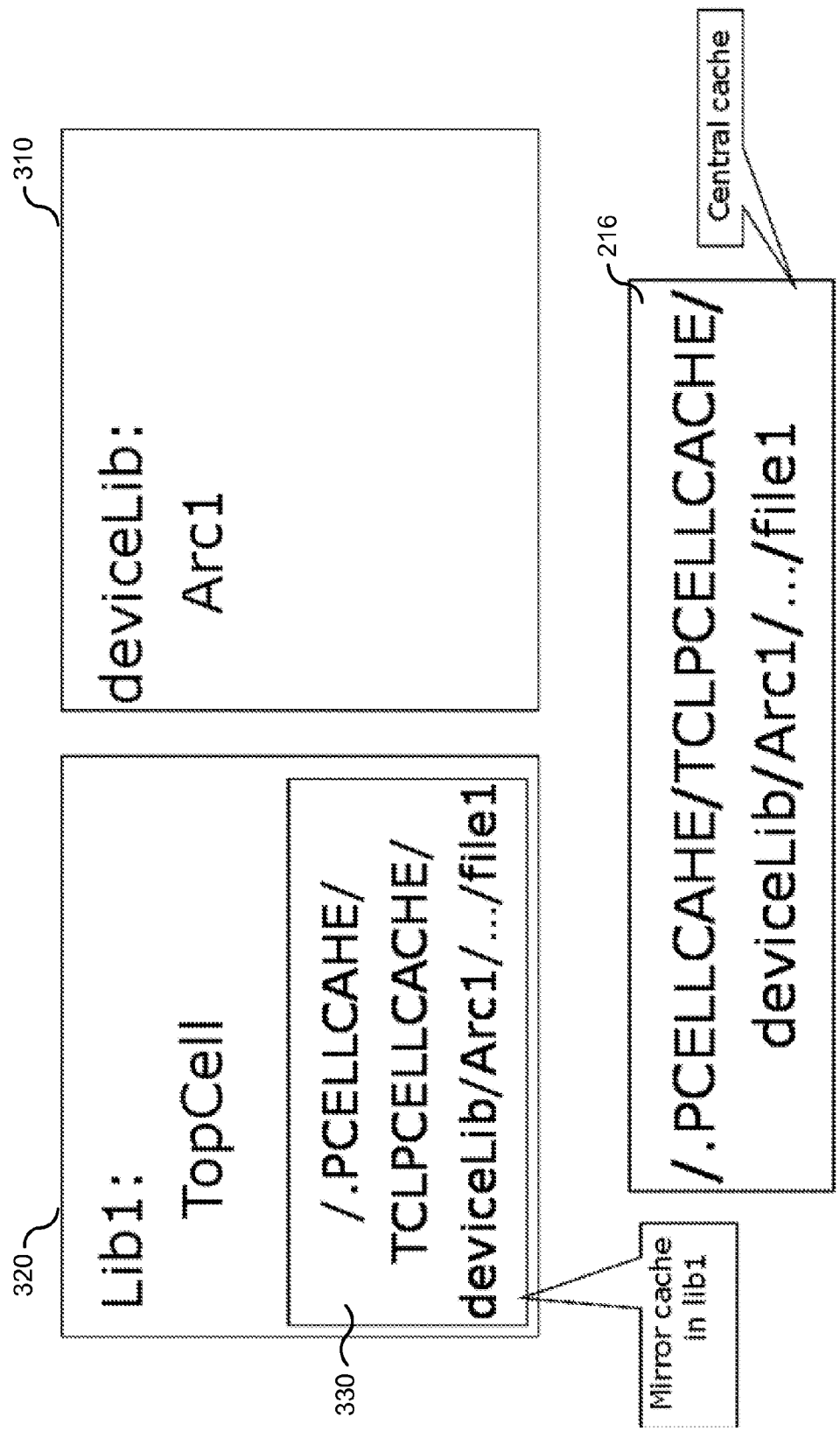
FIG. 3 is a block diagram illustrating pcell mirror caching in accordance with an embodiment.

FIG. 3 is a block diagram illustrating pcell mirror caching in accordance with an embodiment. In this example, library 310 labeled "deviceLib" is a tech library with superMaster Arc1. Library 320 labeled "Lib1" is a design library with topCell as subMaster(deviceLib/Arc1). Mirror cache 330 is provided inside library 320. In one aspect, mirror cache 330 can have the same disk structure as cache file 216.

Figure 4:
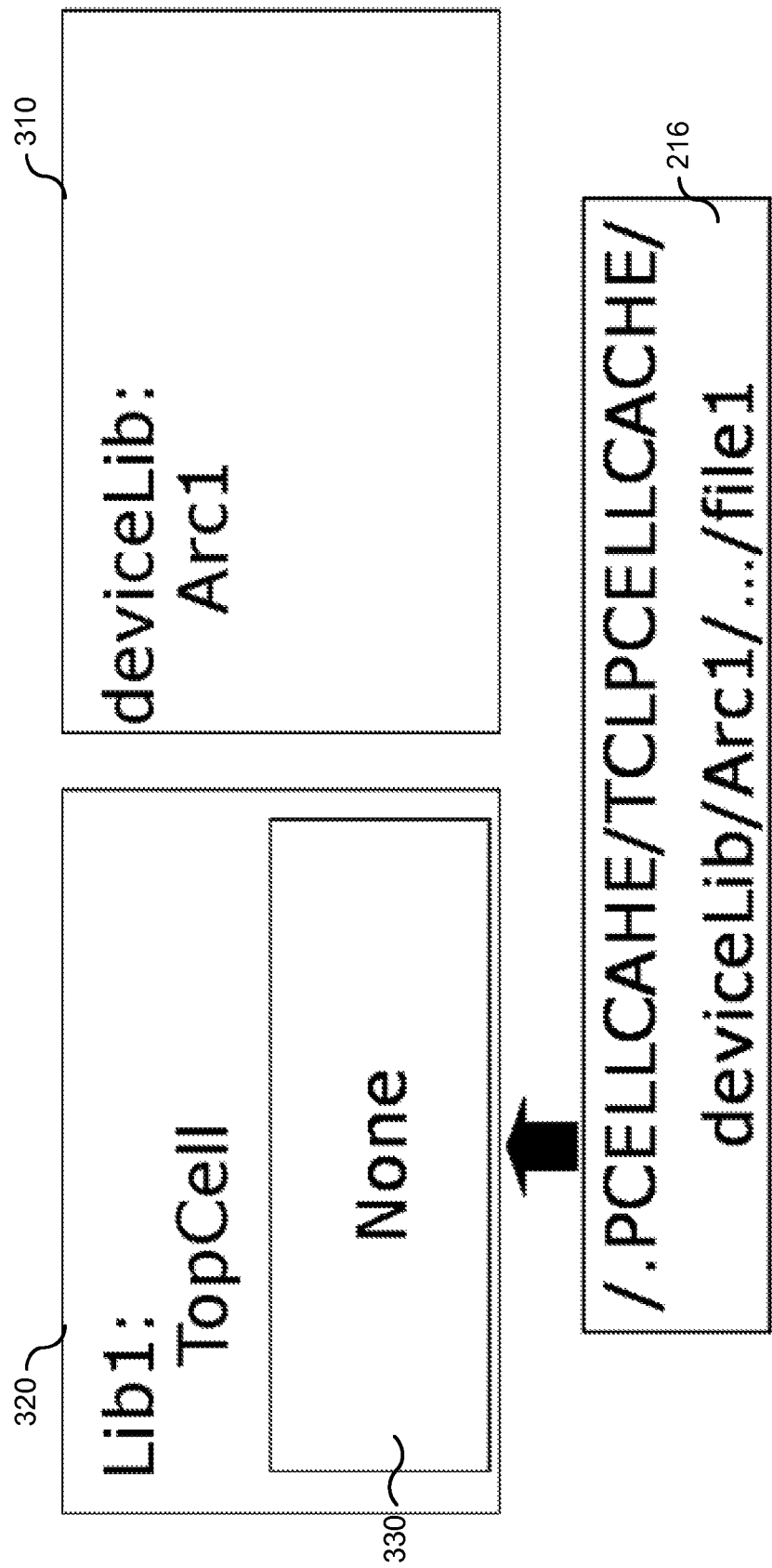
FIG. 4 is a block diagram illustrating an initial state of a pcell mirror cache in a library in accordance with an embodiment.
Figure 5:
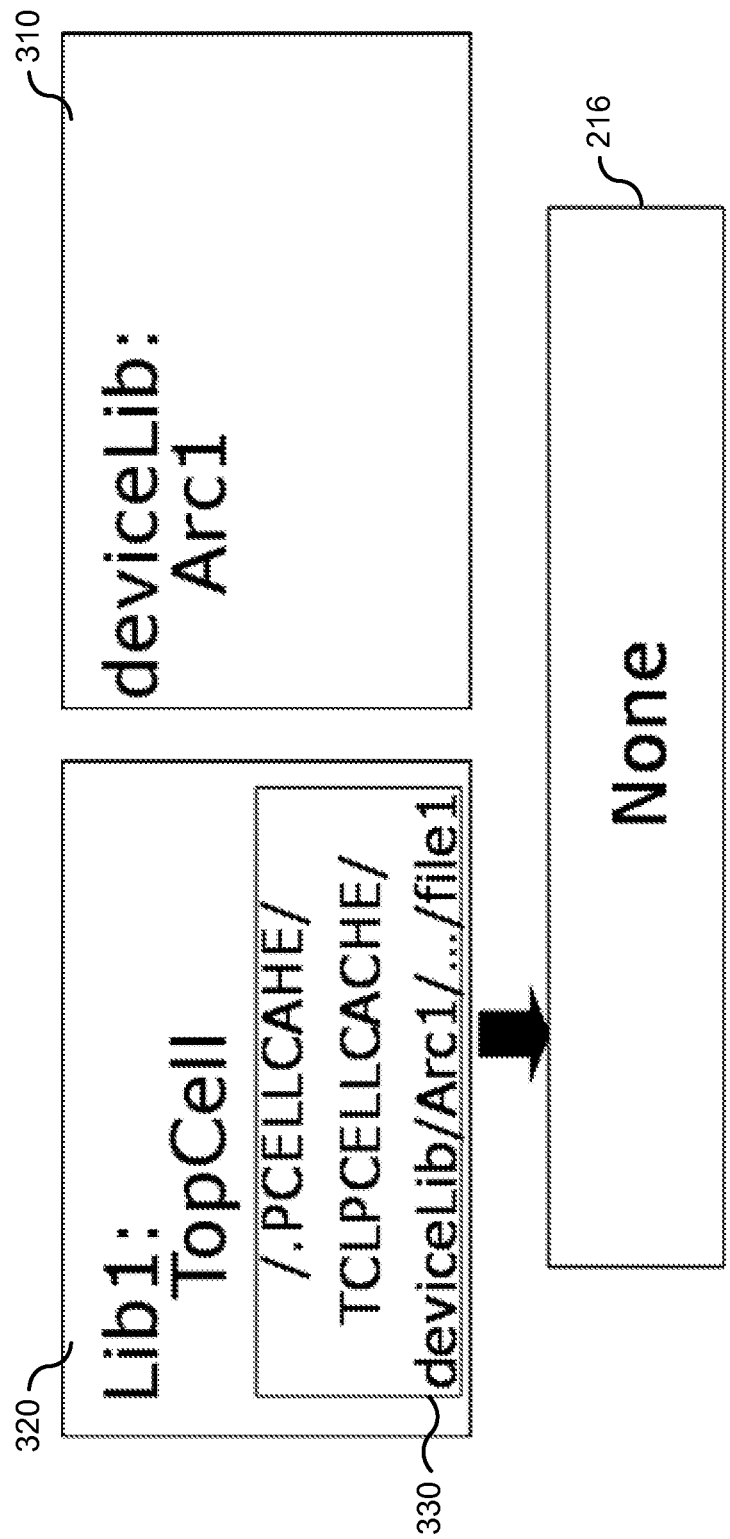
FIG. 5 is a block diagram illustrating synchronization from a pcell mirror cache in a library in accordance with an embodiment.

FIG. 4 is a block diagram illustrating synchronization to a pcell mirror cache in a library in accordance with an embodiment. In this example, when an instance or instance binding is first created, a synchronization event from cache file 216 to mirror 330 occurs if the evaluation result exists in cache file 216 and not in mirror 330. FIG. 5 is a block diagram illustrating synchronization from a pcell mirror cache in a library in accordance with an embodiment. In this example, when an instance or instance binding is first created, a synchronization event from mirror 330 to cache file 216 occurs if the evaluation result exists in mirror 330 and not in cache file 216.

Figure 6:
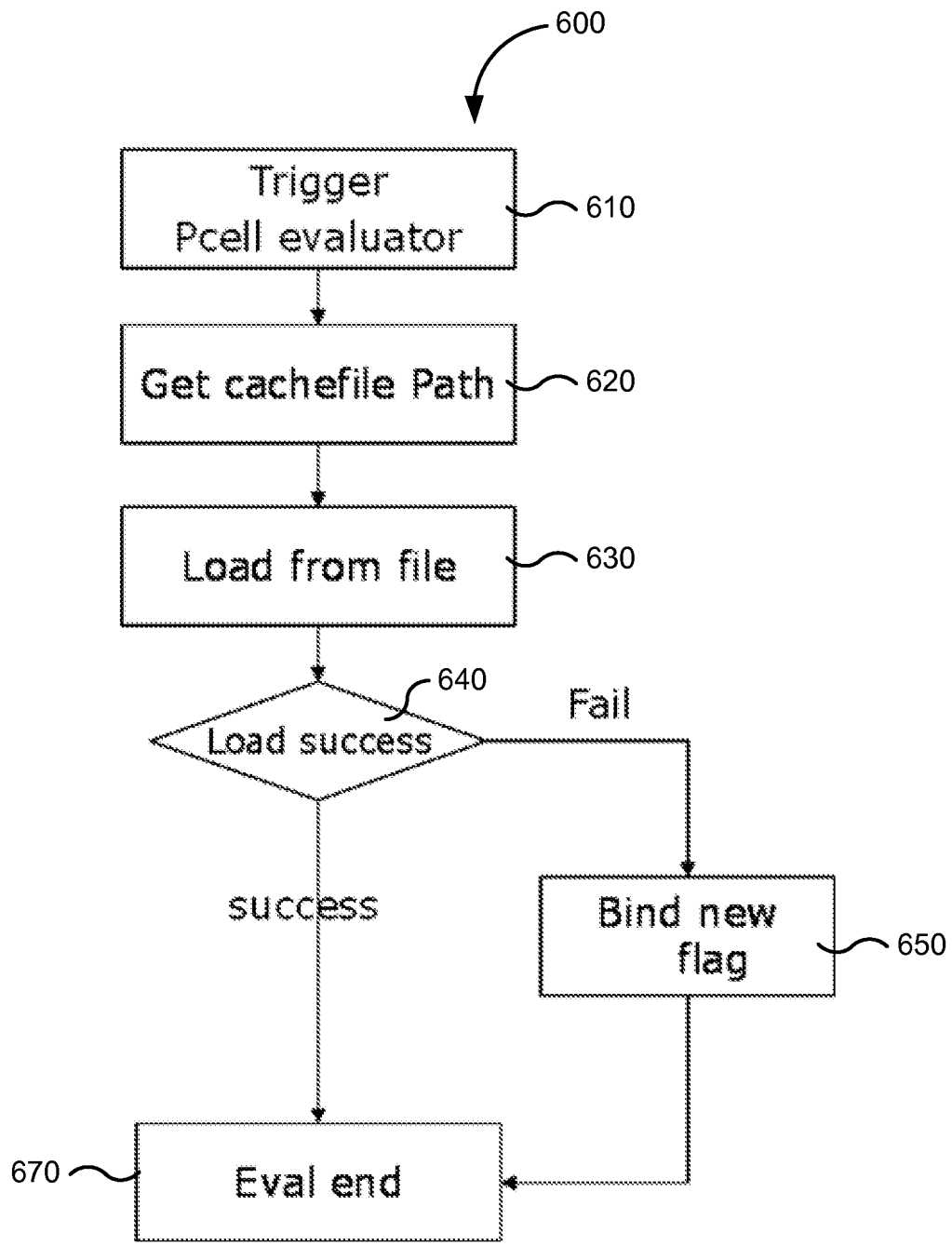
FIG. 6 is a flow diagram of an evaluation process utilizing pcell mirror caching in one embodiment.

FIG. 6 is a flow diagram of evaluation process 600 utilizing pcell mirror caching in one embodiment. Implementations of or processing in evaluation process 600 depicted in FIG. 6 may be performed by software (e.g., instructions or code modules) when executed by a central processing unit (CPU or processor) of a logic machine, such as a computer system or information processing device, by hardware components of an electronic device or application-specific integrated circuits, or by combinations of software and hardware elements. Evaluation process 600 depicted in FIG. 6 begins in step 610 when a pcell evaluator is triggered.

In step 620, a cachefile path is received. In step 630, a cache is loaded in a PCell evaluator. If a load fails in step 640, a new flag is bound on subMaster in step 650. Evaluation is not performed at this point but ends in step 670.

Figure 7:
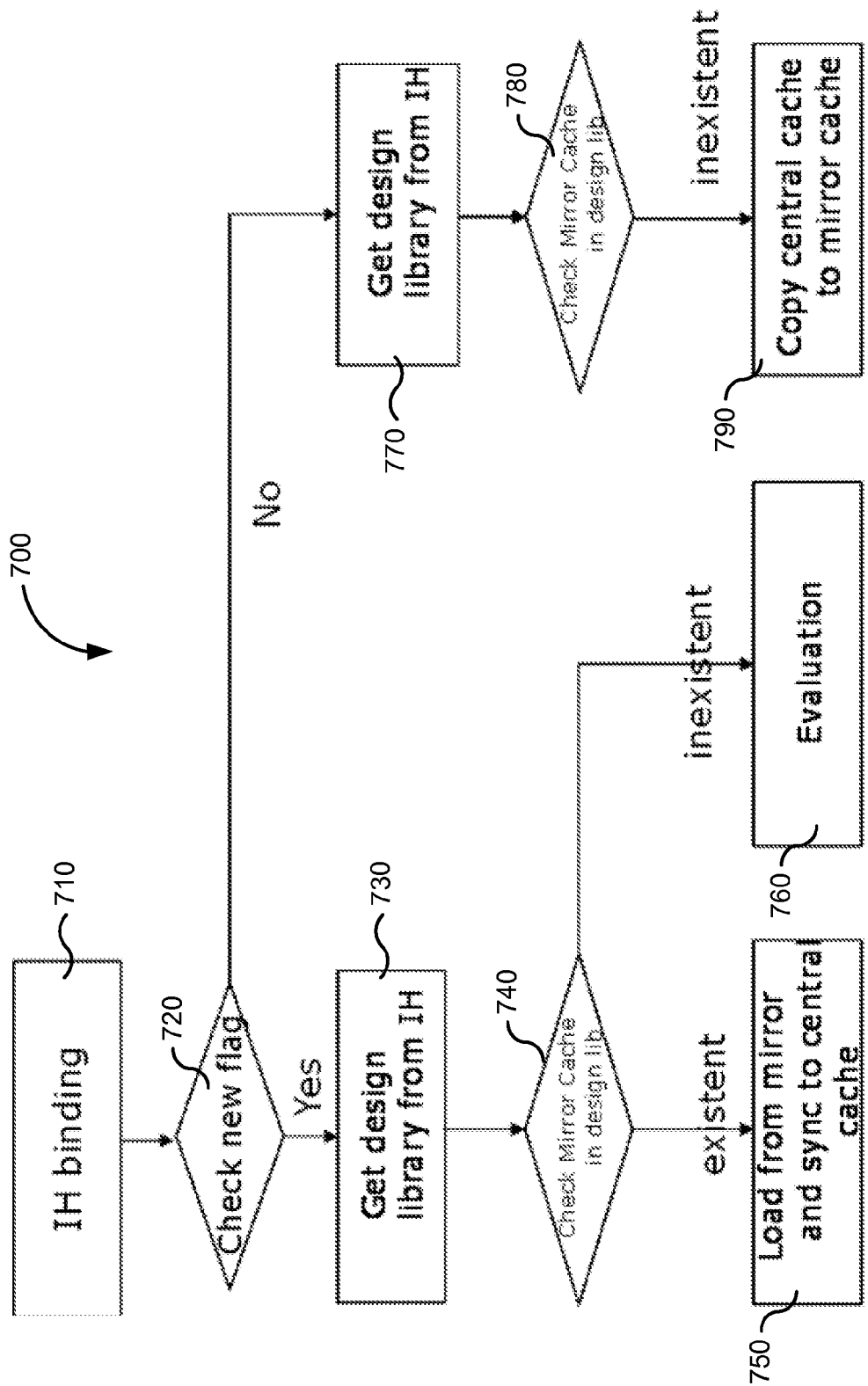
FIG. 7 is a flow diagram of an evaluation process utilizing pcell mirror caching in one embodiment.

FIG. 7 is a flow diagram of evaluation process 700 utilizing pcell mirror caching in one embodiment. Implementations of or processing in evaluation process 700 depicted in FIG. 7 may be performed by software (e.g., instructions or code modules) when executed by a central processing unit (CPU or processor) of a logic machine, such as a computer system or information processing device, by hardware components of an electronic device or application-specific integrated circuits, or by combinations of software and hardware elements. Evaluation process 700 depicted in FIG. 7 begins in step 710 when instance header (IH) binding is triggered.

In step 720, a check is performed to determine whether a new flag is bound to on a subMaster. If a positive determination is made in step 720, in step 730, the design library is obtained from an instance header (IH). In step 740, a determination is made whether a mirror cache is present in the design library. If a positive determination is made in step 740, in step 750, the mirror cache is loaded and synchronized to a central cache. If a negative determination is made in step 740, in step 760, an evaluation is performed to obtain an evaluation result.

If a negative determination is made in step 720, in step 770, the design library is obtained from IH. In step 780, a determination is made whether a mirror cache is present in the design library. If a negative determination is made in step 780, in step 790, the evaluation result is copied from the central cache to the mirror cache in the design library.

In various aspects, caching apparatus 214 includes functionality to persist evaluation results associated with pcells in design 208 across sessions of EDA application 200 as well as across libraries. When library level commands such as copy, rename, delete, and the like are performed, permission and residual directory are checked in the mirror cache of each design library. One or more detail messages may be provided when a library command fails.

Conclusion

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

Figure 8:
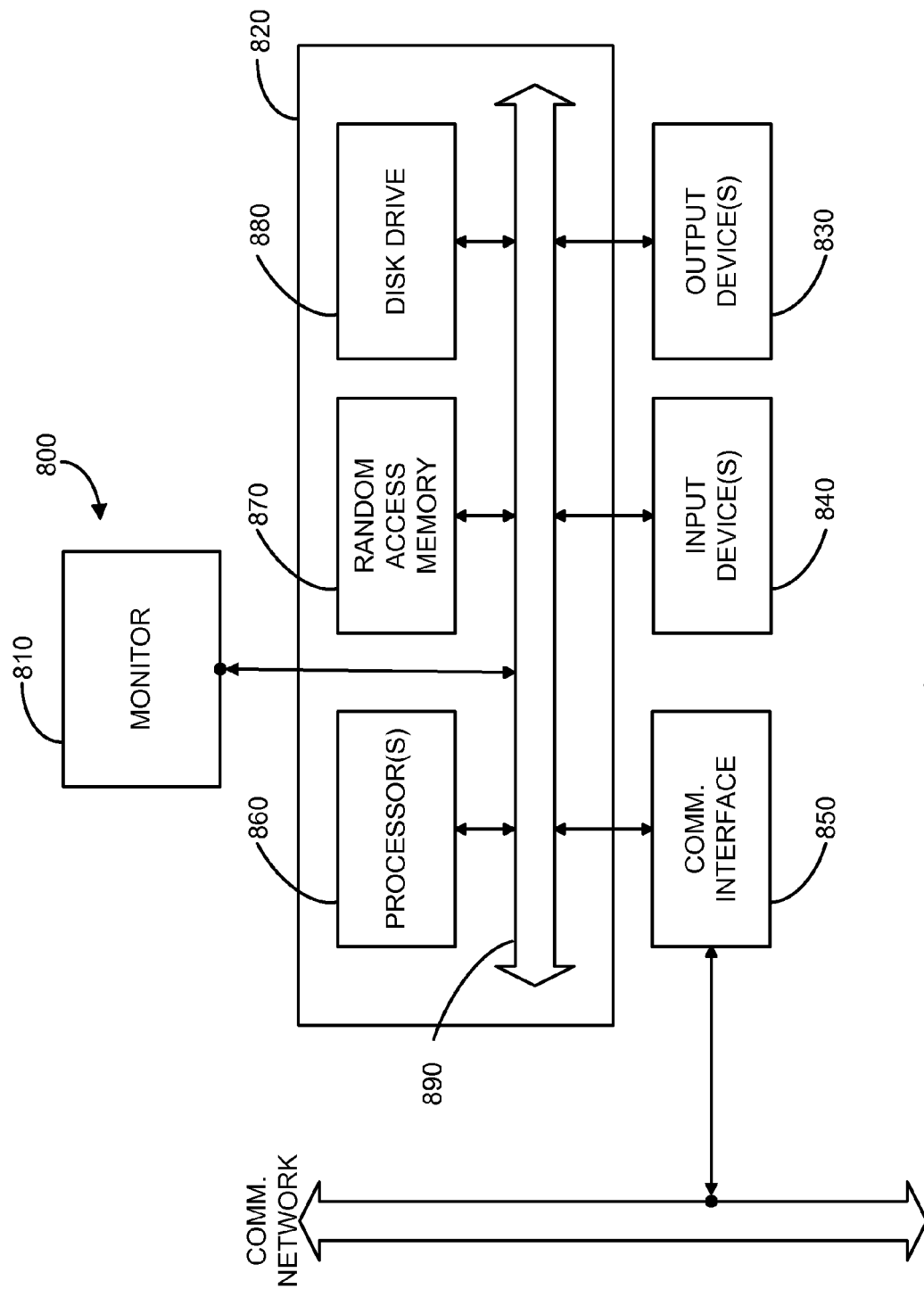
FIG. 8 is a simplified block diagram of a computer system that may incorporate embodiments of the present invention.

FIG. 8 is a simplified block diagram of a computer system 800 that may incorporate embodiments of the present invention. FIG. 8 is merely illustrative of an embodiment incorporating the present invention and does not limit the scope of the invention as recited in the claims. One of ordinary skill in the art would recognize other variations, modifications, and alternatives.

In one embodiment, computer system 800 typically includes a monitor 810, a computer 820, user output devices 830, user input devices 840, communications interface 850, and the like.

As shown in FIG. 8, computer 820 may include a processor (s) 860 that communicates with a number of peripheral devices via a bus subsystem 890. These peripheral devices may include user output devices 830, user input devices 840, communications interface 850, and a storage subsystem, such as random access memory (RAM) 870 and disk drive 880.

User input devices 840 include all possible types of devices and mechanisms for inputting information to computer system 820. These may include a keyboard, a keypad, a touch screen incorporated into the display, audio input devices such as voice recognition systems, microphones, and other types of input devices. In various embodiments, user input devices 840 are typically embodied as a computer mouse, a trackball, a track pad, a joystick, wireless remote, drawing tablet, voice command system, eye tracking system, and the like. User input devices 840 typically allow a user to select objects, icons, text and the like that appear on the monitor 810 via a command such as a click of a button or the like.

User output devices 830 include all possible types of devices and mechanisms for outputting information from computer 820. These may include a display (e.g., monitor 810), non-visual displays such as audio output devices, etc.

Communications interface 850 provides an interface to other communication networks and devices. Communications interface 850 may serve as an interface for receiving data from and transmitting data to other systems. Embodiments of communications interface 850 typically include an Ethernet card, a modem (telephone, satellite, cable, ISDN), (asynchronous) digital subscriber line (DSL) unit, FireWire interface, USB interface, and the like. For example, communications interface 850 may be coupled to a computer network, to a FireWire bus, or the like. In other embodiments, communications interfaces 850 may be physically integrated on the motherboard of computer 820, and may be a software program, such as soft DSL, or the like.

In various embodiments, computer system 800 may also include software that enables communications over a network such as the HTTP, TCP/IP, RTP/RTSP protocols, and the like. In alternative embodiments of the present invention, other communications software and transfer protocols may also be used, for example IPX, UDP or the like.

In some embodiment, computer 820 includes one or more Xeon microprocessors from Intel as processor(s) 860. Further, one embodiment, computer 820 includes a UNIX-based operating system.

RAM 870 and disk drive 880 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, read-only-memories (ROMS), battery-backed volatile memories, networked storage devices, and the like. RAM 870 and disk drive 880 may be configured to store the basic programming and data constructs that provide the functionality of the present invention.

Software code modules and instructions that provide the functionality of the present invention may be stored in RAM 870 and disk drive 880. These software modules may be executed by processor(s) 860. RAM 870 and disk drive 880 may also provide a repository for storing data used in accordance with the present invention.

RAM 870 and disk drive 880 may include a number of memories including a main random access memory (RAM) for storage of instructions and data during program execution and a read only memory (ROM) in which fixed instructions are stored. RAM 870 and disk drive 880 may include a file storage subsystem providing persistent (non-volatile) storage for program and data files. RAM 870 and disk drive 880 may also include removable storage systems, such as removable flash memory.

Bus subsystem 890 provides a mechanism for letting the various components and subsystems of computer 820 communicate with each other as intended. Although bus subsystem 890 is shown schematically as a single bus, alternative embodiments of the bus subsystem may utilize multiple busses.

FIG. 8 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other micro processors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims. In addition, the technique and system of the present invention is suitable for use with a wide variety of EDA tools and methodologies for designing, testing, and/or manufacturing integrated circuits or other electronic devices. The scope of the invention should, therefore, be determined not with reference to the above description, but instead should be determined with reference to the pending claims along with their full scope or equivalents.

Various embodiments of any of one or more inventions whose teachings may be presented within this disclosure can be implemented in the form of logic in software, firmware, hardware, or a combination thereof. The logic may be stored in or on a machine-accessible memory, a machine-readable article, a tangible computer-readable medium, a computer-readable storage medium, or other computer/machine-readable media as a set of instructions adapted to direct a central processing unit (CPU or processor) of a logic machine to perform a set of steps that may be disclosed in various embodiments of an invention presented within this disclosure. The logic may form part of a software program or computer program product as code modules become operational with a processor of a computer system or an information-processing device when executed to perform a method or process in various embodiments of an invention presented within this disclosure. Based on this disclosure and the teachings provided herein, a person of ordinary skill in the art will appreciate other ways, variations, modifications, alternatives, and/or methods for implementing in software, firmware, hardware, or combinations thereof any of the disclosed operations or functionalities of various embodiments of one or more of the presented inventions.

The disclosed examples, implementations, and various embodiments of any one of those inventions whose teachings may be presented within this disclosure are merely illustrative to convey with reasonable clarity to those skilled in the art the teachings of this disclosure. As these implementations and embodiments may be described with reference to exemplary illustrations or specific figures, various modifications or adaptations of the methods and/or specific structures described can become apparent to those skilled in the art. All such modifications, adaptations, or variations that rely upon this disclosure and these teachings found herein, and through which the teachings have advanced the art, are to be considered within the scope of the one or more inventions whose teachings may be presented within this disclosure. Hence, the present descriptions and drawings should not be considered in a limiting sense, as it is understood that an invention presented within a disclosure is in no way limited to those embodiments specifically illustrated.

Accordingly, the above description and any accompanying drawings, illustrations, and figures are intended to be illustrative but not restrictive. The scope of any invention presented within this disclosure should, therefore, be determined not with simple reference to the above description and those embodiments shown in the figures, but instead should be determined with reference to the pending claims along with their full scope or equivalents.

What is claimed is:

1. A method comprising:
   persisting, using one or more computer systems, evaluation results associated with a variant of a parameterized cell at a location in at least one of a central cache file or a mirror cache file in a design library;
   mapping, using the one or more computer systems, the variant to the location;
   instantiating, using the one or more computer systems, the parameterized cell from either the cache file or the mirrored cache file when the cache file or the mirrored cache file contains the evaluation result; and
   synchronizing the evaluation result from the mirror cache file to the central cache file in response to a determination that the central cache file fails to include the evaluation result.

2. The method of claim 1 further comprising synchronizing the evaluation result from the central cache file to the mirror cache file in response to a determination that the mirror cache file fails to include the evaluation result.

3. The method of claim 1 further comprising delaying instantiation of the parameterized cell from an evaluation stage to an instance header binding stage.

4. The method of claim 1 further comprising receiving the evaluation results associated with the parameterized cell in the design from one or more parameterized cell evaluators.

5. The method of claim 1 further comprising:
receiving information associated with the parameterized cell;
performing one or more evaluations to determine the variant; and
generating information associated with the variant.

6. A non-transitory computer-readable medium storing program code executable by one or more processors associated with one or more computer systems, the non-transitory computer-readable medium comprising:
code for persisting evaluation results associated with a variant of a parameterized cell at a location in at least one of a central cache file or a mirror cache file in a design library;
code for mapping the variant to the location;
code for instantiating the parameterized cell from either the cache file or the mirrored cache file when the cache file or the mirrored cache file contains the evaluation result; and
code for synchronizing the evaluation result from the mirror cache file to the central cache file in response to a determination that the central cache file fails to include the evaluation result.

7. The non-transitory computer-readable medium of claim 6 further comprising code for synchronizing the evaluation result from the central cache file to the mirror cache file in response to a determination that the mirror cache file fails to include the evaluation result.

8. The non-transitory computer-readable medium of claim 6 further comprising code for delaying instantiation of the parameterized cell from an evaluation stage to an instance header binding stage.

9. The non-transitory computer-readable medium of claim 6 further comprising code for receiving the evaluation results associated with the parameterized cell in the design from one or more parameterized cell evaluators.

10. The non-transitory computer-readable medium of claim 6 further comprising:
code for receiving information associated with the parameterized cell;
code for performing one or more evaluations to determine the variant; and
code for generating information associated with the variant.

11. A system for placing option devices within circuits, the system comprising:
a processor; and
a memory configured to store a set of instructions that when executed by the processor configure the processor to:
persist evaluation results associated with a variant of a parameterized cell at a location in at least one of a central cache file or a mirror cache file in a design library;
map the variant to the location;
instantiate the parameterized cell from either the cache file or the mirrored cache file when the cache file or the mirrored cache file contains the evaluation result; and
synchronize the evaluation result from the mirror cache file to the central cache file in response to a determination that the central cache file fails to include the evaluation result.

12. The system of claim 11 wherein the set of instructions further configure the processor to synchronize the evaluation result from the central cache file to the mirror cache file in response to a determination that the mirror cache file fails to include the evaluation result.

13. The system of claim 11 wherein the set of instructions further configure the processor to delay instantiation of the parameterized cell from an evaluation stage to an instance header binding stage.

14. The system of claim 11 wherein the set of instructions further configure the processor to receive the evaluation results associated with the parameterized cell in the design from one or more parameterized cell evaluators.

15. The system of claim 11 wherein the set of instructions further configure the processor to:
receive information associated with the parameterized cell;
perform one or more evaluations to determine the variant; and
generate information associated with the variant.

* * * * *